United States Patent
Irokawa et al.

(10) Patent No.: US 9,190,483 B2
(45) Date of Patent: Nov. 17, 2015

(54) AlN SINGLE CRYSTAL SCHOTTKY BARRIER DIODE AND METHOD OF PRODUCING THE SAME

(71) Applicant: National Institute for Materials Science, Tsukuba-shi, Ibaraki (JP)

(72) Inventors: Yoshihiro Irokawa, Tsukuba (JP); Kiyoshi Shimamura, Tsukuba (JP); Encarnacion Antonia Garcia Villora, Tsukuba (JP)

(73) Assignee: NATIONAL INSTITUTE FOR MATERIALS SCIENCE, Tsukuba-shi, Ibaraki (JP)

(*) Notice: Subject to any disclaimer, the term of this patent is extended or adjusted under 35 U.S.C. 154(b) by 0 days.

(21) Appl. No.: 14/374,331

(22) PCT Filed: Jan. 30, 2013

(86) PCT No.: PCT/JP2013/052086
§ 371 (c)(1),
(2) Date: Jul. 24, 2014

(87) PCT Pub. No.: WO2013/115269
PCT Pub. Date: Aug. 8, 2013

(65) Prior Publication Data
US 2015/0034961 A1    Feb. 5, 2015

(30) Foreign Application Priority Data
Jan. 30, 2012 (JP) .................. 2012-016926

(51) Int. Cl.
*H01L 29/20* (2006.01)
*H01L 29/872* (2006.01)
(Continued)

(52) U.S. Cl.
CPC ........ *H01L 29/66212* (2013.01); *H01L 29/452* (2013.01); *H01L 29/475* (2013.01); *H01L 29/872* (2013.01); *H01L 29/2003* (2013.01)

(58) Field of Classification Search
CPC .................................................. H01L 29/2003
USPC .......................................................... 257/76
See application file for complete search history.

(56) References Cited

U.S. PATENT DOCUMENTS

| 7,678,195 B2* | 3/2010 | Schlesser et al. ............... 117/94 |
| 2008/0032881 A1 | 2/2008 | Kobayashi |
| 2011/0175201 A1 | 7/2011 | Tokuyama et al. |

FOREIGN PATENT DOCUMENTS

| JP | A-2006-066556 | 3/2006 |
| JP | 2006/513122 | 4/2006 |

(Continued)

OTHER PUBLICATIONS

Baliga, B. J., Modern Power Devices, Krieger Publishing Company, Florida, 1992, pp. 158-159.
(Continued)

*Primary Examiner* — Daniel Shook
(74) *Attorney, Agent, or Firm* — Drinker Biddle & Reath LLP (57) ABSTRACT

An AlN single crystal Schottky barrier diode including: an AlN single crystal substrate having a defect density of $10^6$ $cm^{-2}$ or less and a thickness of 300 μm or more; a first electrode formed on one surface of the AlN single crystal substrate; and a second electrode formed on one surface of the AlN single crystal substrate while being spaced apart from the first electrode, the AlN single crystal Schottky barrier diode being provided with: a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V.

20 Claims, 4 Drawing Sheets

(51) Int. Cl.
*H01L 29/66* (2006.01)
*H01L 29/45* (2006.01)
*H01L 29/47* (2006.01)

(56) References Cited

FOREIGN PATENT DOCUMENTS

| JP | 2006-278570 | 10/2006 |
|---|---|---|
| JP | 2007-173744 | 7/2007 |
| JP | 2008-56553 | 3/2008 |
| JP | 2010-042950 | 2/2010 |
| JP | A-2010-182977 | 8/2010 |
| WO | WO 2004/061923 A1 | 7/2004 |
| WO | WO 2011/086730 | 7/2011 |

OTHER PUBLICATIONS

Zhang, A.P., et al., "Temperature Dependence and Current Transport Mechanisms in AlxGalxN Schotty Rectifiers," Applied Physics Letters, vol. 76,, No. 25, 2000, pp. 3816-3818.
Taniyasu, Y., et al., "An Aluminum Nitride Light-Emitting Diode with a Wavelength of 210 Nanometres," Nature Publishing Group, vol. 441, No. 18, May 2006, pp. 325-328.
Miyanaga, et al., "Single Crystal Growth of AlN by Sublimation Method," SEI Technical Review, vol. 168, Mar. 2006, pp. 103-106 (Abstract).
Oshima, et al., "Glowth of AlN Single Crystals by Sublimation Method," Abstract #2455, Honolulu Prime (2012), The Electrochemical Society.
Irokawa, et al., "Shottky Barrier Diodes on AlN Free-Standing Substrates," Japanese Journal of Applied Physics 51 (2012) pp. 040206-1 thru 040206-3.
Written Opinion of the International Searching Authority dated Apr. 16, 2013 issued in International appliction No. PCT/JP2013/052086.
International Search Report dated Apr. 16, 2013 that issued in International application No. PCT/JP2013/052086.
Yoshitaka Taniyasu et al., "Fabrication and characterization of Si-doped n-type AlN Schottky diodas", 65th The Japan Society of Applied Physics 2004 Atumn Meeting Proceedings, Sep. 2004, p. 278.
A Japanese Office Action (with attached partial English-language translation) dated Jan. 20, 2015 that issued in Japanese patent application No. 2013-556473.
Issei Satoh et al: "Sublimation growth of nonpolar AlN single crystals and defect characterization", Physica Status Solidi (C), vol. 7, No. 7-8, Jul. 10, 2010, pp. 1767-1769, XP055211283, ISSN: 1862-6351, DOI: 10.1002/pssc.200983590.
Miyanaga et al: "Evaluation of AlN single-crystal grown by sublimation method", Journal of Crystal Growth, Elsevier, Amsterdam, NL, vol. 300, No. 1, Feb. 28, 2007, pp. 45-49, XP005915210, ISSN: 0022-0248, DOI: 10.1016/J.JCRYSGRO.2006.10.233.
R. Dalmau et al: "Growth and Characterization of Ain and AlGaN Epitaxial Films on Ain Single Crystal Substrates", Journal of the Electrochemical Society, vol. 158, No. 5, Jan. 1, 2011, p. H530, XP055125840, ISSN: 0013-4651, DOI: 10.1149/1.3560527.
Bondokov R T et al: "Large-area AlN substrates for electronic applications: An industrial perspective", Journal of Crystal Growth, Elsevier, Amsterdam, NL, vol. 301, No. 17, Aug. 15, 2008, pp. 4020-4026, XP023977043, ISSN: 0022-0248, DOI: 10.1016/J.JCRYSGRO.2008.06.032 [retrieved on Jun. 17, 2008].
Makarov et al: "Experimental and theoretical analysis of sublimation growth of AlN bulk crystals", Journal of Crystal Growth, Elsevier, Amsterdam, NL, vol. 310, No. 5, Nov. 19, 2007, pp. 881-886, XP022492816, ISSN: 0022-0248, DOI: 10.1016/J.JCRYSGRO.2007.11.059.
Search Report dated Sep. 22, 2015 for European Patent Application No. 13742926.2.

\* cited by examiner

ALN SINGLE CRYSTAL SCHOTTKY BARRIER DIODE AND METHOD OF PRODUCING THE SAME

TECHNICAL FIELD

The present invention relates to an AlN single crystal Schottky barrier diode and a method of producing the same.

Priority is claimed on Japanese Patent Application No. 2012-016926, filed Jan. 30, 2012, the content of which is incorporated herein by reference.

BACKGROUND ART

In recent years, attempts have been made actively to improve the energy efficiency of the power elements such as a power diode. Examples of the power diodes include Schottky barrier diodes (SBD) for obtaining rectifying properties. Since the power elements made of silicon materials are approaching the theoretical limit, the search for other materials that are more suitable for the power elements has been actively conducted.

It has been shown, in theory, that the semiconductor materials having a wide band gap and which were regarded conventionally as insulating materials are suitable as power elements (Non-Patent Document 1). Examples of the semiconductor materials having a wide band gap include metal nitrides such as gallium nitride (GaN) having a band gap of 3.4 eV, and AlN having a band gap of 6.2 eV. At present, power elements using GaN have been researched and developed actively. In addition, there are also reported cases of diodes using AlGaN (Non-Patent Document 2).

There is a reported example of aluminum nitride (AlN) diode that emits ultraviolet light with the shortest wavelength of 210 nm (Non-Patent Document 3). However, the AlN used in the diode is one formed as a thin film on a SiC substrate through heteroepitaxial growth, and is not a bulk single crystal of good quality. Further, the AlN diode is a p-n junction diode, and is not suitable for power diodes, since the ON resistance theoretically increases as compared with the Schottky barrier diode which is a power diode.

Production of high quality AlN single crystals is difficult and the device integration thereof is difficult, and thus the AlN Schottky diode operation has not been conventionally confirmed. For this reason, AlN has not attracted attention as a power element material until now.

It has been reported that it is possible to grow a large AlN single crystal on a SiC substrate by a sublimation method (Non-Patent Document 4). However, the AlN single crystal has not been reported as having semiconductor properties which may be used to form a Schottky barrier diode.

CITATION LIST

Non-Patent Documents

Non-Patent Document 1: B. J. Baliga, Modern Power Devices (Krieger Publishing Company, Florida, 1992).

Non-Patent Document 2: A. P. Zhang et al., Appl. Phys. Lett. 76, 3816 (2000)

Non-Patent Document 3: Y. Taniyasu, M. Kasu and T. Makimoto, Nature 441 (2006) 325.

Non-Patent Document 4: Miyanaga, et al., March 2006, SEI Technical Review, 168, p. 103-106

SUMMARY OF INVENTION

Technical Problem

An object of the present invention is to provide an AlN single crystal Schottky barrier diode which is provided with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V; and a method of producing the same.

Solution to Problem

In view of the above circumstances, the inventors of the present invention conceived that if an AlN single crystal of high quality can be used, it is possible to improve the performance, such as the high voltage resistance and low on-resistance characteristics, and to use for power diodes such as the Schottky barrier diode. In addition, the present inventors have produced an AlN single crystal of high quality having a diameter of 5 mm or more and also a thickness of 500 µm or more by a sublimation method; and then polished and processed the AlN single crystal into an AlN single crystal substrate having a defect density of $10^6$ cm$^{-2}$ or less, a diameter of 5 mm or more, and a thickness of 300 µm or more; further formed an electrode to produce an AlN single crystal Schottky barrier diode of high quality; and confirmed that the diode is provided with a rectifying property such that an on-off ratio at the time of applying 10 V and −40 V is at least $10^3$ even at a high temperature of 573 K, a high voltage resistance such that a voltage can be applied at least within a range of −40 V to 10 V, and a low on-resistance characteristic such that a current begins to flow at no greater than 5 V, thereby completing the present invention.

The present invention includes the following aspects.

A first aspect of the present invention is an AlN single crystal Schottky barrier diode characterized by including an AlN single crystal substrate having a defect density of $10^6$ cm$^{-2}$ or less and a thickness of 300 µm or more; a first electrode formed on one surface of the aforementioned AlN single crystal substrate; and a second electrode formed on one surface of the aforementioned AlN single crystal substrate while being spaced apart from the aforementioned first electrode.

The AlN single crystal Schottky barrier diode having the above configuration is provided with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V.

The first electrode and second electrode described above may be formed directly on one surface of the aforementioned AlN single crystal.

A second aspect of the present invention is the AlN single crystal Schottky barrier diode according to the aforementioned first aspect, which is an AlN single crystal Schottky barrier diode characterized in that the aforementioned first electrode is an ohmic electrode, and the aforementioned second electrode is a Schottky electrode.

A third aspect of the present invention is the Schottky barrier diode according to the aforementioned second aspect, which is an AlN single crystal Schottky barrier diode characterized in that the aforementioned first electrode is formed by laminating Ti, Al, Pt, and Au in this order from the aforementioned AlN single crystal substrate side, and the aforementioned second electrode is formed by laminating Pt and Au in this order from the aforementioned AlN single crystal substrate side.

A fourth aspect of the present invention is the MN single crystal Schottky barrier diode according to any one of the aforementioned first to third aspects, which is an AlN single crystal Schottky barrier diode characterized by further including an AlN epitaxial layer (AlN single crystal epitaxial layer) formed on one surface of the aforementioned AlN single crystal substrate, wherein the aforementioned first electrode and the aforementioned second electrode are formed on the aforementioned AlN epitaxial layer.

A fifth aspect of the present invention is the MN single crystal Schottky barrier diode according to any one of the aforementioned first to fourth aspects, which is an AlN single crystal Schottky barrier diode characterized in that the aforementioned AlN single crystal substrate contains oxygen at an arbitrary concentration from $10^{14}$ to $10^{20}$ atoms/cm$^3$.

A sixth aspect of the present invention is the AlN single crystal Schottky barrier diode according to any one of the aforementioned first to fifth aspects, which is an AlN single crystal Schottky barrier diode characterized in that the aforementioned AlN single crystal substrate contains Si at an arbitrary concentration from $10^{14}$ to $10^{20}$ atoms/cm$^3$.

A seventh aspect of the present invention is a method of producing an AlN single crystal Schottky barrier diode characterized by including a step of producing an AlN single crystal having a diameter of 5 mm or more and a thickness of 500 m or more by a sublimation method; a step of forming the aforementioned AlN single crystal into a plate shape and then polishing both sides thereof, thereby processing into an AlN single crystal substrate having a defect density of $10^6$ cm$^{-2}$ or less, a diameter of 5 mm or more, and a thickness of 300 μm or more; and a step of forming a first electrode and a second electrode, while being spaced apart from each other, on one surface of the aforementioned AlN single crystal substrate by a deposition method or a sputtering method.

An eighth aspect of the present invention is the method of producing a Schottky barrier diode according to the aforementioned seventh aspect, which is a method of producing an AlN single crystal Schottky barrier diode characterized in that the aforementioned first electrode is formed by laminating Ti, Al, Pt, and Au in this order from the aforementioned AlN single crystal substrate side, and the aforementioned second electrode is formed by laminating Pt and Au in this order from the aforementioned AlN single crystal substrate side.

A ninth aspect of the present invention is the method of producing a Schottky barrier diode according to the aforementioned seventh or eighth aspect, which is a method of producing an AlN single crystal Schottky barrier diode characterized in that an AlN single crystal having a substantially cylindrical shape and produced by a sublimation method is cut in a direction perpendicular to an axial direction to thereby form the aforementioned AlN single crystal into a plate shape.

A tenth aspect of the present invention is the method of producing an AlN single crystal Schottky barrier diode according to any one of the aforementioned seventh to ninth aspects, which is a method of producing an AlN single crystal Schottky barrier diode characterized in that the aforementioned first electrode and the aforementioned second electrode are formed after washing the aforementioned AlN single crystal substrate with an organic solvent and an acid.

An eleventh aspect of the present invention is the method of producing an AlN single crystal Schottky barrier diode according to any one of the aforementioned seventh to tenth aspects, which is a method of producing an AlN single crystal Schottky barrier diode characterized by further including a step of forming an AlN epitaxial layer on one surface of the aforementioned AlN single crystal substrate, wherein the aforementioned first electrode and the aforementioned second electrode are formed on the aforementioned AlN epitaxial layer.

A twelfth aspect of the present invention is the method of producing an AlN single crystal Schottky barrier diode according to any one of the aforementioned seventh to eleventh aspects, which is a method of producing an AlN single crystal Schottky barrier diode characterized in that the aforementioned step of producing an AlN single crystal by a sublimation method includes a step of forming a first AlN layer on a crystal growth substrate by carrying out heating for 5 hours to 50 hours at a sublimation temperature of AlN raw materials, followed by cooling of the aforementioned crystal growth substrate to room temperature; and further includes a step of forming an AlN single crystal on the aforementioned first AlN layer by heating the AlN raw materials at the sublimation temperature which is carried out once or a plurality of times. The step of forming an AlN single crystal on the first AlN layer described above may be a step conducted once or may be a step conducted a plurality of times. When it is a step conducted a plurality of times, for example, a step in which the first AlN layer is formed and is then cooled to room temperature, and the AlN raw materials are renewed, followed by an increase in the temperature to sublimate the AlN raw materials is repeated a plurality of times.

In the twelfth aspect described above, the aforementioned sublimation temperature may be from 1,700 to 2,500° C.

Advantageous Effects of Invention

The AlN single crystal Schottky barrier diode of the present invention includes an AlN single crystal substrate having a defect density of $10^6$ cm$^{-2}$ or less and a thickness of 300 μm or more; a first electrode formed on one surface of the aforementioned AlN single crystal substrate; and a second electrode formed on one surface of the aforementioned AlN single crystal substrate while being spaced apart from the aforementioned first electrode. By means of this configuration, it is possible to provide an AlN single crystal Schottky barrier diode which is provided with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V.

The method of producing an AlN single crystal Schottky barrier diode according to the present invention includes a step of producing an AlN single crystal having a diameter of 5 mm or more and a thickness of 500 μm or more by a sublimation method; a step of forming the aforementioned AlN single crystal into a plate shape and then polishing both sides thereof, thereby processing into an AlN single crystal substrate having a defect density of $10^6$ cm$^{-2}$ or less, a diameter of 5 mm or more, and a thickness of 300 μm or more; and a step of forming a first electrode and a second electrode, while being spaced apart from each other, on one surface of the aforementioned AlN single crystal substrate by a deposition method or a sputtering method. By means of this configuration, it is possible to produce an AlN single crystal Schottky barrier diode which is provided with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V.

DESCRIPTION OF EMBODIMENTS

Hereinafter, with reference to the accompanying drawings, an AlN single crystal Schottky barrier diode according to an embodiment of the present invention and a method of producing the same will be described.
<AlN Single Crystal Schottky Barrier Diode>

First, an AlN single crystal Schottky barrier diode according to an embodiment of the present invention will be described.

Figure 1A:
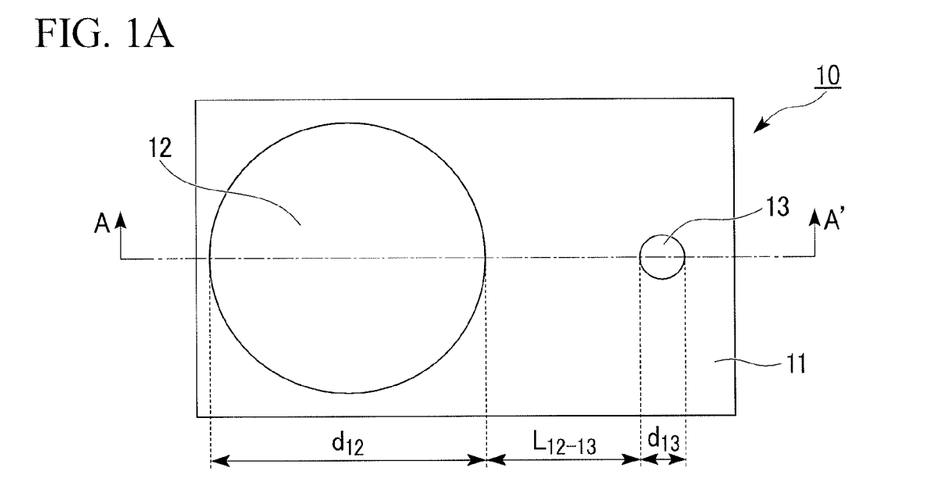
FIG. 1A is a schematic plan view showing an example of an AlN single crystal Schottky barrier diode of the present invention.
Figure 1B:
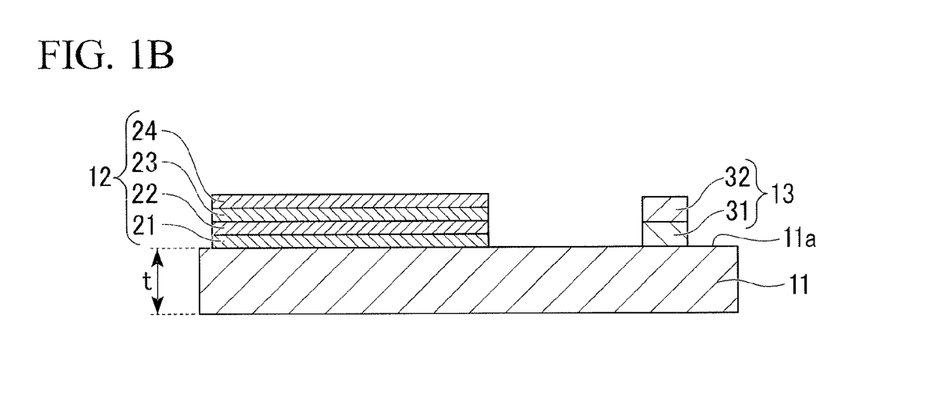
FIG. 1B is a schematic cross-sectional view taken along the line A-A' of the AlN single crystal Schottky barrier diode shown in FIG. 1A.

FIGS. 1A and 1B are diagrams showing an example of the AlN single crystal Schottky barrier diode according to an embodiment of the present invention, and FIG. 1A is a plan view, whereas FIG. 1B is a cross-sectional view taken along the line A-A' in FIG. 1A.

As shown in FIG. 1A, an AlN single crystal Schottky barrier diode 10 mainly includes an AlN single crystal substrate 11 having a substantially oblong in plan view, a first electrode 12 having a substantially circular shape in plan view, and a second electrode 13 having a substantially circular shape in plan view.

The AlN single crystal substrate 11 is a single crystal substrate of good quality having a defect density of $10^6$ cm$^{-2}$ or less. The defect density refers to the number of defects contained in a unit area and can be measured by etch pit density measurement or the like. As a result of the defect density being equal to or less than $10^6$ cm$^{-2}$, the AlN single crystal Schottky barrier diode 10 is provided with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V. When the defect density exceeds $10^6$ cm$^{-2}$, there will be cases where any one of these characteristics is not satisfied. It should be noted that in the Schottky barrier diode of the present invention, an on-off ratio at the time of applying 10 V and −40 V of at least $10^3$ even at a high temperature of 573 K and a large on-off ratio of $10^5$ at room temperature have been confirmed.

It is preferable to configure the AlN single crystal substrate 11 such that the Si concentration and the oxygen concentration can be controlled to an arbitrary concentration of not more than $10^{20}$. The formation of AlN single crystal by the sublimation method has also been reported in Non-Patent Document 4, but the application to the Schottky barrier diode has not been reported. In the production process of the AlN single crystal, there is a possibility that a trace amount of Si and oxygen is mixed. If the concentration of these elements functioning as donors is not appropriately controlled, desired semiconductor properties cannot be obtained even when an AlN single crystal is obtained. In the present invention, we have succeeded in producing an AlN single crystal substrate having desired semiconductor properties which can be applied to the Schottky barrier diode. Judging from the obtained properties such as the voltage resistance, it is estimated that the AlN obtained in Examples contains oxygen at a level approximately equal to or less than the detection limit of SIMS. In addition, it is considered that the Si concentration is also controlled to a concentration equal to or less than the detection limit of SIMS. It should be noted that the AlN single crystal substrate may contain about $10^{14}$ to $10^{20}$ atoms/cm$^3$ of Si and may contain $10^{14}$ to $10^{20}$ atoms/cm$^3$ of oxygen.

The AlN single crystal substrate 11 shown in FIG. 1A is configured to have a substantially oblong in plan view. However, the shape of the substrate is not limited to this and may be configured to have, for example, a substantially rectangular shape in plan view, a substantially linear shape in plan view or a substantially polygonal shape in plan view.

Further, the first electrode 12 is configured to have a substantially circular shape in plan view, but is not limited thereto, and may be configured to have a substantially rectangular shape in plan view, a substantially linear shape in plan view or a substantially polygonal shape in plan view. A diameter d12 of the first electrode 12 is set to 500 µm in Examples. However, it is not limited to this size, and it may be a diameter in the range of equal to or more than 500 µm.

Furthermore, the second electrode 13 is configured to have a substantially circular shape in plan view, but is not limited thereto, and may be configured to have a substantially rectangular shape in plan view, a substantially linear shape in plan view, or a substantially polygonal shape in plan view. A diameter d13 of the second electrode 13 is set to 80 µm in Examples. However, it is not limited to this size, and it may be a diameter in the range of equal to or more than 50 µm.

As shown in FIG. 1B, the AlN single crystal Schottky barrier diode 10 is configured by forming the first electrode 12 and the second electrode 13 that are spaced apart from each other on one surface 11a of the AlN single crystal substrate 11. A separation distance (distance between the electrodes) L12-13 which is a distance between the closest parts is set to 300 µm in Examples.

However, the distance between the electrodes L12-13 is not limited thereto, and may be set in a range of equal to or more than 5 µm.

A thickness t of the AlN single crystal substrate 11 is set to 300 µm or more. By making the thickness t equal to or more than 300 µm, the AlN single crystal Schottky barrier diode 10 can be configured as a Schottky barrier diode provided with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V. There are some cases where any one of these properties is not satisfied if the thickness t is less than 300 µm.

The first electrode 12 is configured as a four layer structure composed of a first layer 21, a second layer 22, a third layer 23, and a fourth layer 24 from the one surface 11a side.

In the configuration of Examples, the first layer 21 is composed of Ti. Ti exhibits high adhesion with the AlN single crystal substrate 11, and can further form an ohmic electrode of good quality because it reacts with N in AlN and generates N vacancies. The fourth layer 24 is composed of Au. Au is capable of protecting the first electrode 12 with high stability. The second layer 22 is composed of Al, and the third layer 23 is composed of Pt. These are bonding layers between the first layer and the fourth layer in order to enhance the adhesion of each layer.

The layer thicknesses can be configured such that the first layer 21 is from 5 to 30 nm, the second layer 22 is from 50 to 200 nm, the third layer 23 is from 30 to 50 nm, and the fourth layer 24 is from 70 to 200 nm. For example, in Examples, the thickness of each layer is set to 20 nm, 100 nm, 40 nm, and 100 nm. It is preferable to set the total layer thickness of the first electrode portion 12 in a range equal to or more than 250 nm and equal to or less than 500 nm.

The first electrode 12 is not limited to a four layer structure, and may be configured as a 1 to 3 layer structure or may be configured as a multi-layer structure of five or more layers. In addition, the materials of each layer are not limited to the metals described above, as long as they can form the AlN single crystal substrate 11 and the electrodes with high adhesion, and also with low resistance, and also with high stability.

The second electrode 13 is configured as a two layer structure composed of a first layer 31 and a second layer 32 from the one surface 11a side.

In the configuration of Examples, the first layer 31 is composed of Pt. Pt has a large work function and can form a Schottky electrode with high adhesion with the AlN single crystal substrate 11. The second layer 32 is composed of Au. Au is capable of protecting the first electrode 12 with high stability. Pt and Au can be formed with high adhesion without providing a bonding layer.

It can be configured such that the thickness of the first layer 31 is from 10 to 30 nm, and the thickness of the second layer 32 is from 50 to 150 nm. For example, in Examples, the thickness of each layer is set to 25 nm and 100 nm. It is preferable to set the total layer thickness of the second electrode portion 13 in a range equal to or more than 100 nm and equal to or less than 200 nm.

The second electrode 13 is not limited to a two layer structure and may be configured as a one layer structure or may be configured as a multi-layer structure of three or more layers. In addition, the materials of each layer are not limited to the metals described above, as long as they have a large work function and can form the AlN single crystal substrate 11 and the Schottky electrode with high adhesion and also with high stability.

Figure 1C:
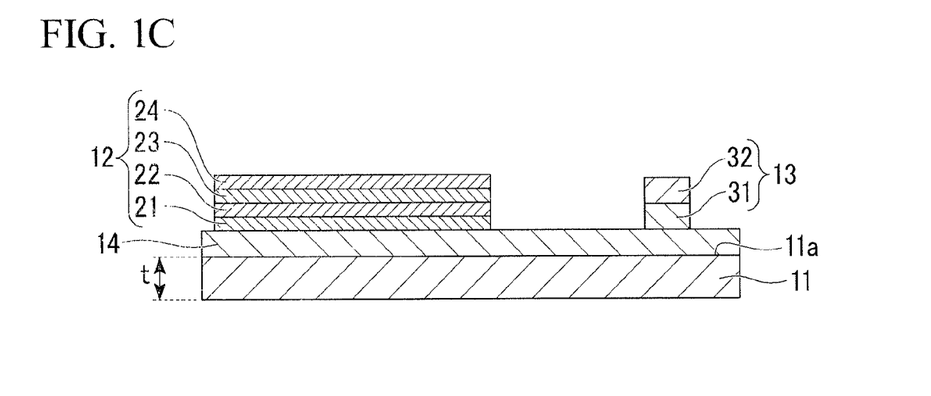
FIG. 1C is a schematic cross-sectional view showing another example of the AlN single crystal Schottky barrier diode of the present invention.

FIG. 1C is a cross sectional view showing another embodiment of a Schottky barrier diode. As shown in FIG. 1C, it may be configured such that an AlN epitaxial layer (AlN single crystal epitaxial film) 14 is formed on the one surface 11a of the AlN single crystal substrate 11, and the first electrode 12 and the second electrode 13 are formed on the AlN epitaxial layer 14. As a result, the device characteristics can be improved. It is preferable to set the film thickness of the AlN epitaxial layer from 0.1 µm to 10 µm. A predetermined amount of elements such as Si and O that function as donors or elements such as Mg and Be that function as acceptors may be added to the AlN epitaxial layer. The preferred added amount of Si is from $10^{14}$ to $10^{20}$ atoms/cm$^3$, the preferred added amount of O is from $10^{14}$ to $10^{20}$ atoms/cm$^3$, the preferred added amount of Mg is from $10^{14}$ to $10^{20}$ atoms/cm$^3$, and the preferred added amount of Be is from $10^{14}$ to $10^{20}$ atoms/cm$^3$.

<Method of Producing AlN Single Crystal Schottky Barrier Diode>

A method of producing an AlN single crystal Schottky barrier diode according to an embodiment of the present invention includes an AlN single crystal producing step S1, an AlN single crystal substrate processing step S2, and an electrode forming step S3.

(AlN Single Crystal Producing Step S1)

The AlN single crystal producing step S1 is a step of producing an AlN single crystal having a diameter of 5 mm or more and also a thickness of 500 µm or more by a sublimation method.

Figure 2:
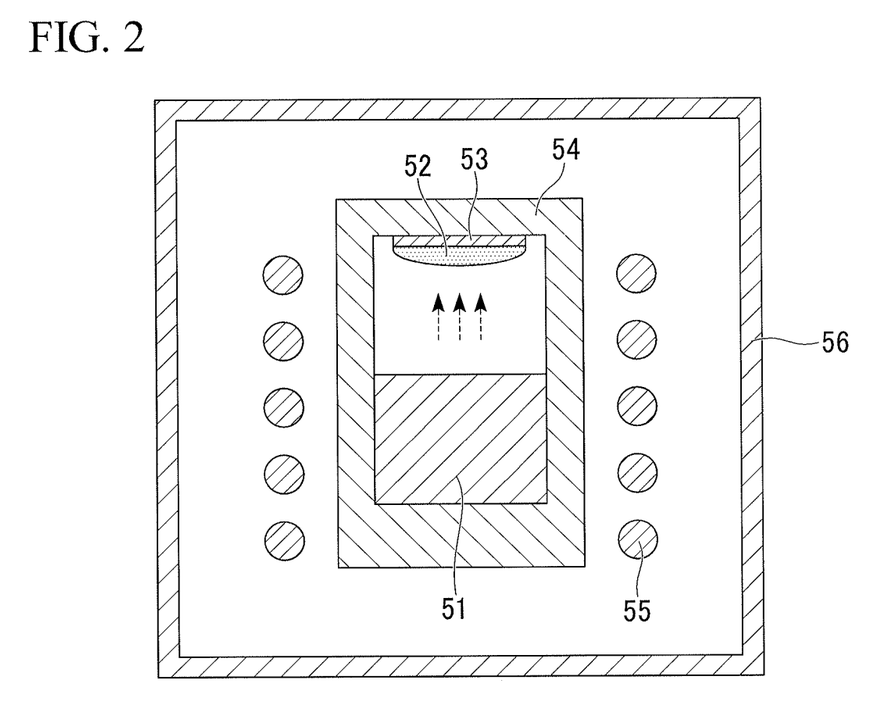
FIG. 2 is a schematic view showing an example of an AlN single crystal growth apparatus according to a sublimation method.

FIG. 2 is a schematic diagram showing an example of a crystal growth vessel and a crystal growth furnace by the sublimation method.

First, an AlN raw material powder 51 of high purity is filled in a lower part inside a crystal growth vessel (crucible) 54 having a cylindrical shape.

Then, after attaching a crystal growth substrate 53 onto an inner side surface of a lid of the crystal growth vessel, the crystal growth vessel 54 is sealed. As the crystal growth substrate 53, for example, a SiC substrate is used. The crystal growth substrate 53 has a disc shape and the diameter m thereof is set to 5 mm or more. As a result, it is possible to grow an AlN single crystal having a diameter of 5 mm or more. The crystal growth substrate 53 is disposed such that one surface thereof is opposed to the AlN raw material powder 51 of high purity.

Then, the crystal growth vessel 54 is disposed at the central part of an axis of an RF heating coil 55 inside a crystal growth furnace 56.

Next, the crystal growth vessel 54 is heated by the RF heating coil 55, and the AlN raw material powder 51 of high purity is heated to a predetermined temperature and held for a certain period of time at that temperature. As a result, the filled AlN raw material powder 51 of high purity can be sublimated and decomposed. For example, the predetermined temperature may be set from 1,700 to 2,500° C., for example, from 1,900 to 2,250° C., and the sublimation temperature may be a temperature exceeding 2,250° C. and not more than 2,500° C. The holding time is not particularly limited. For example, it may be from 1 to 50 hours or from 1 to 24 hours, or may be held for a more prolonged period of time (50 hours or more).

The sublimated AlN raw material powder 51 of high purity is redeposited and recrystallized on one surface of the substrate 53 having a temperature lower than the heating temperature of the MN raw material powder 51 of high purity by 100 to 500° C. As a result, it is possible to grow an AlN single crystal on one surface of the crystal growth substrate 53. The crystal is grown until the thickness thereof reaches 500 µm or more.

Thereafter, the temperature is lowered to room temperature, and the crystal growth substrate 53 on which an MN single crystal 52 having a maximum diameter of 5 mm or more and a thickness of 500 μm or more has been grown is taken out.

It should be noted that with the methods other than the sublimation method, it is not currently possible to obtain a single crystal substrate of good quality having a defect density of $10^6$ cm$^{-2}$ or less.

Note that when growing an AlN single crystal by the sublimation method, it is also possible such that a first AlN layer is formed on the crystal growth substrate by the aforementioned sublimation method, followed by the lowering of the temperature to room temperature, and an AlN single crystal (second AlN layer) is grown on the first AlN layer by conducting the aforementioned sublimation method once again. In this case, it is possible to grow a good single crystal because AlN of the first AlN layer becomes a crystal nucleus. It should be noted that the aforementioned two-stage single crystal production may be carried out in a continuous manner without taking out the crystal growth vessel 54 from the crystal growth furnace 56. Alternatively, it is also possible that after forming the first AlN layer, the crystal growth vessel 54 is taken out from the inside of the furnace, replenished with the AlN raw material powder and placed once again inside the crystal growth furnace 56 to grow an AlN single crystal. The first AlN layer can be formed by setting the holding time at the sublimation temperature from about 5 hours to about 50 hours. A step of growing an AlN single crystal on the first AlN layer once again by the aforementioned sublimation method may be performed by carrying out sublimation once or a plurality of times. In the case of carrying out sublimation a plurality of times, a step is repeated several times in which the first AlN layer is formed and then cooled to room temperature, and a new AlN raw material is provided, followed by an increase in the temperature to sublimate the AlN raw material. The heating time in this step is not particularly limited. By appropriately selecting the heating time during sublimation and/or the number of repetitions of sublimation, it is possible to form an AlN single crystal having a desired thickness.

Then, the AlN single crystal 52 is detached from the crystal growth substrate 53. It can be easily detached.

The AlN single crystal is produced through the steps described above.

(AlN Single Crystal Substrate Processing Step S2)

The AlN single crystal substrate processing step S2 is a step of processing the AlN single crystal, by polishing both sides thereof, into an AlN single crystal substrate 61 having a defect density of $10^6$ cm$^{-2}$ or less, a diameter of 5 mm or more, and also a thickness of 300 μm or more.

First, when the AlN single crystal 52 has a disc shape, by polishing both sides thereof, it is processed into the AlN single crystal substrate 61 having a defect density of $10^6$ cm$^{-2}$ or less, a diameter of 5 mm or more, and also a thickness of 300 μm or more. For example, when the AlN single crystal 52 has a substantially disc shape with the maximum diameter of 5 mm and a thickness of 500 μm, both sides thereof are polished as it is to set the thickness to 300 μm.

When the AlN single crystal 52 does not have a disc shape, first, it is cut into a disc shape, and then by polishing both sides thereof, it is processed into the AlN single crystal substrate 61 having a defect density of $10^6$ cm$^{-2}$ or less, a diameter of 5 mm or more, and also a thickness of 300 μm or more.

For example, when the AlN single crystal 52 has a substantially cylindrical shape with the maximum diameter of 5 mm and a thickness of 5,000 μm, first, it is cut in a direction perpendicular to the axial direction to be processed into a substantially disc shape with a thickness of 500 μm, and then both sides thereof are polished to set the thickness to 300 μm.

Next, the AlN single crystal substrate 61 is washed with an organic solvent and an acid.

The AlN single crystal substrate 61 is processed through the steps described above.

(Electrode Forming Step S3)

The electrode forming step S3 is a step of forming the first electrode 12 and the second electrode 13 that are spaced apart from each other on one surface of the AlN single crystal substrate 61 by a deposition method or a sputtering method.

First, a metal mask (first electrode mask) provided with a hole portion having a substantially circular shape in plan view with a predetermined diameter is placed on one surface of the AlN single crystal substrate 61, and then, for example, Ti, Al, Pt, and Au are laminated in this order from the AlN single crystal substrate 61 side by a deposition method or a sputtering method to form the first electrode 12 having a substantially circular shape in plan view with a predetermined diameter.

The predetermined diameter may be about 500 μm or more, and is set to, for example, 500 μm.

Next, a heat treatment is carried out in a nitrogen atmosphere. The heat treatment is carried out at 700 to 900° C. for 15 to 45 seconds, for example, at 750° C. for 30 seconds. As a result, the structure of the first electrode 12 can be stabilized.

Next, the first electrode mask is removed, and a metal mask (second electrode mask) provided with a hole portion having a substantially circular shape in plan view with a predetermined diameter (for example, diameter of 80 μm) so as to achieve a predetermined distance between the electrodes is placed on one surface of the AlN single crystal substrate 61, and then Pt and Au are laminated in this order form the AlN single crystal substrate 61 side to form the second electrode 13 having a substantially circular shape in plan view with a predetermined diameter.

The predetermined distance between the electrodes is at least 5 μm, and is set to, for example, 300 μm. In addition, the predetermined diameter is about 500 μm or more, and is set to, for example, 500 μm.

The electrodes are formed through the steps described above.

As a result, the AlN single crystal Schottky barrier diode 10 is formed on a piece of the AlN single crystal substrate 61. Thereafter, the following dicing step is carried out.

(Dicing Step)

Figure 3:
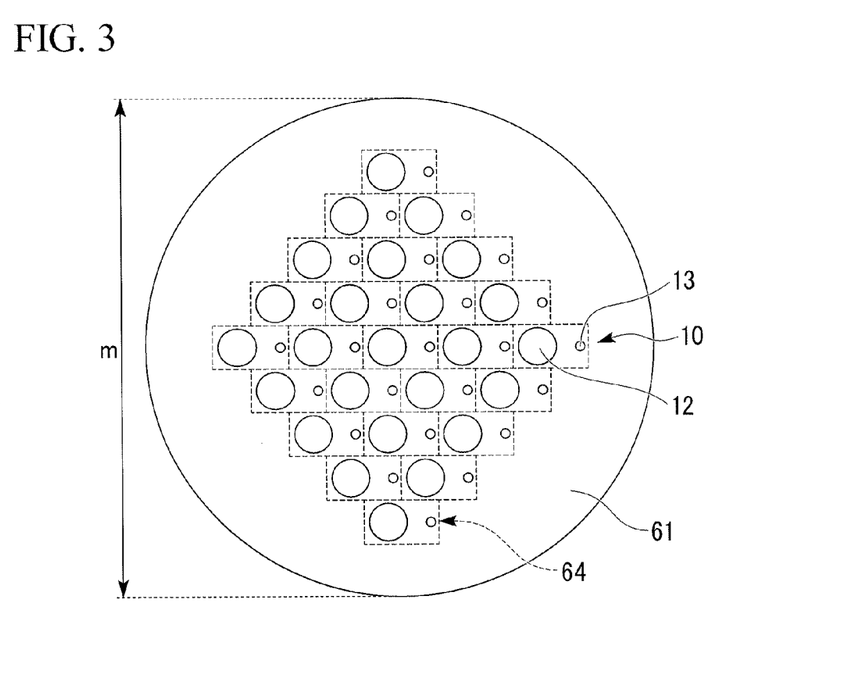
FIG. 3 is a schematic plan view showing an example in which a plurality of first electrodes and a plurality of second electrodes are formed on one side of an AlN single crystal substrate.

FIG. 3 is a plan view showing one example in which a plurality of the first electrodes 12 and a plurality of the second electrodes 13 are formed on one surface of the AlN single crystal substrate 61.

It should be noted that a dicing line 64 that divides into elements having a substantially oblong in plan view is shown.

Next, it is divided along the dicing line 64 using a dicer.

The AlN single crystal Schottky barrier diode 10 according to the embodiment of the present invention is produced through the steps described above.

It should be noted that when producing an AlN single crystal Schottky barrier diode having an epitaxial layer as shown in FIG. 1C, it may be configured such that after the AlN single crystal processing step S2, an AlN epitaxial layer is formed on the AlN single crystal substrate 61 using, for example, an MOCVD or an MBE apparatus, and the first electrode 12 and the second electrode 13 are then formed on the MN epitaxial layer in the electrode forming step S3. At this time, it is preferable to set the thickness of the AlN epitaxial layer from 0.1 μm to 10 μm. As mentioned above, a predetermined amount of elements such as Si, O, Mg, and Be may be contained in the AlN epitaxial layer.

(Diode Characteristics Evaluation)

Figure 4:
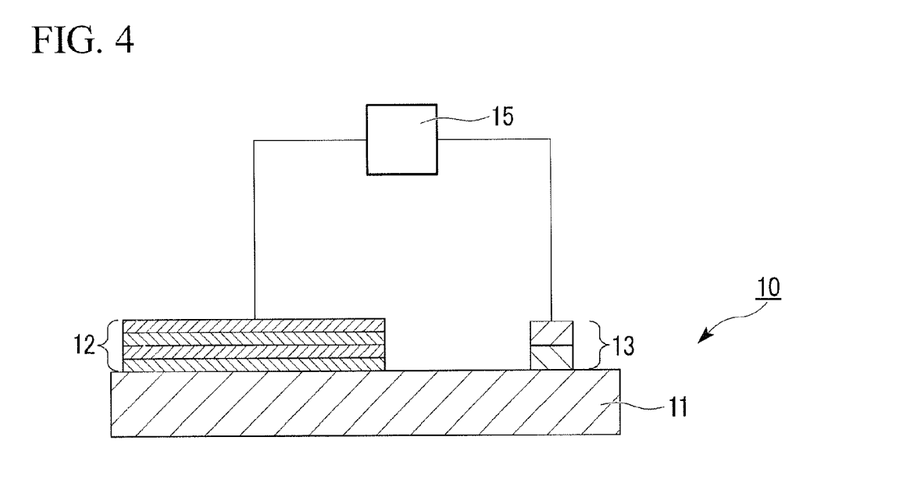
FIG. 4 is a schematic view showing a state in which the AlN single crystal Schottky barrier diode of the present invention is connected to a power source.
Figure 5:
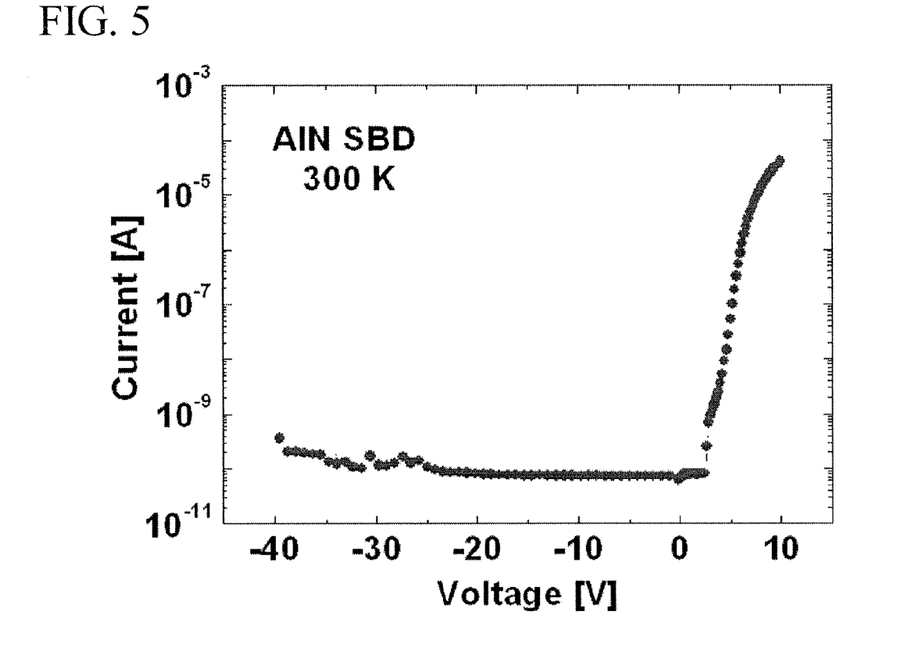
FIG. 5 is a current-voltage characteristic of an AlN single crystal Schottky barrier diode (device of Example 1: AlN SBD) at 300 K.

FIG. 4 is a schematic diagram showing a state where an AlN single crystal Schottky barrier diode according to the embodiment of the present invention is connected with a power source. As shown in FIG. 5, the first electrode 12 and the second electrode 13 are connected to a power source 15, and a voltage is applied to the AlN single crystal Schottky barrier diode 10 by operating the power source 15 to evaluate the diode characteristics.

The AlN single crystal Schottky barrier diode 10 according to the embodiment of the present invention includes the AlN single crystal substrate 11 having a defect density of $10^6$ cm$^{-2}$ or less and a thickness of 300 μm or more, the first electrode 12 formed on one surface 11a of the AlN single crystal substrate 11, and the second electrode 13 formed on the one surface 11a of the AlN single crystal substrate 11 while being spaced apart from the first electrode 12. By means of this configuration, it is possible to provide the MN single crystal Schottky barrier diode 10 with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V.

The AlN single crystal Schottky barrier diode 10 according to an embodiment of the present invention has a configuration in which the first electrode 12 is an ohmic electrode and the second electrode 13 is a Schottky electrode, and thus can be made to operate as a Schottky barrier diode.

The AlN single crystal Schottky barrier diode 10 according to an embodiment of the present invention has a configuration in which the first electrode 12 is formed by laminating Ti, Al, Pt, and Au in this order from the AlN single crystal substrate 11 side, and the second electrode 13 is formed by laminating Pt and Au in this order from the aforementioned AlN single crystal substrate 11 side, and thus can be made into an AlN single crystal Schottky barrier diode having favorable diode characteristics.

A method of producing the MN single crystal Schottky barrier diode 10 according to an embodiment of the present invention includes a step of producing an AlN single crystal 52 having a diameter of 5 mm or more, and also a thickness of 500 μm or more by a sublimation method; a step of forming the aforementioned AlN single crystal into a plate shape, and then polishing both sides thereof, thereby processing into an AlN single crystal substrate 61 having a defect density of $10^6$ cm$^{-2}$ or less, a diameter of 5 mm or more, and also a thickness of 300 μm or more; and a step of forming a first electrode 12 and a second electrode 13 that are spaced apart from each other, on one surface of the AlN single crystal substrate 61 by a deposition method or a sputtering method. By means of this configuration, it is possible to produce an AlN single crystal Schottky barrier diode which is provided with a rectifying property such that an on-off ratio at the time of applying 10 V and −40 V is at least $10^3$ even at a high temperature of 573 K; a high voltage resistance such that a voltage can be applied at least within a range of −40 V to 10 V; and a low on-resistance characteristic such that a current begins to flow at no greater than 5 V.

Since a method of producing the AlN single crystal Schottky barrier diode 10 according to an embodiment of the present invention has a configuration in which the first electrode 12 is formed by laminating Ti, Al, Pt, and Au in this order from the AlN single crystal substrate 61 side, and also the second electrode 13 is formed by laminating Pt and Au in this order from the AlN single crystal substrate 61 side, it is possible to produce an AlN single crystal Schottky barrier diode having favorable diode characteristics.

Since a method of producing the AlN single crystal Schottky barrier diode 10 according to an embodiment of the present invention has a configuration in which the AlN single crystal 52 having a substantially cylindrical shape is cut in a direction perpendicular to an axial direction to form the AlN single crystal 52 into a plate shape, it is possible to produce, with high productivity, an AlN single crystal Schottky barrier diode having extremely favorable diode characteristics.

Since a method of producing the AlN single crystal Schottky barrier diode 10 according to an embodiment of the present invention has a configuration in which the first electrode 12 and the second electrode 13 are formed after washing the AlN single crystal substrate 61 with an organic solvent and an acid, it is possible to produce an AlN single crystal Schottky barrier diode having favorable diode characteristics.

The AlN single crystal Schottky barrier diode and the production method thereof according to the embodiments of the present invention are not limited to the above embodiments, and can be implemented with various modifications within the scope of the technical spirit of the present invention. Specific examples of the present embodiment are shown in the following Examples. However, the present invention is not limited to these Examples.

EXAMPLES

Example 1

Production of AlN Single Crystal Schottky Barrier Diode

First, an AlN single crystal was produced by a sublimation method.

The production conditions in the sublimation method and the configuration of the produced AlN single crystal are shown in Table 1.

A cylindrical vessel having a diameter (inner diameter) of 10 mm and a depth of 50 mm was used as a crystal growth vessel. A SiC substrate having a diameter of 5 mm and an AlN raw material powder of high purity were enclosed inside the vessel and heated for 10 hours at a heating temperature of 2,000° C. in an RF furnace. As a result, an AlN single crystal having a diameter of 5 mm and a thickness of 0.5 mm was formed on the substrate.

TABLE 1

| Crystal growth vessel | Shape | Cylindrical |
|---|---|---|
| | Diameter (mm) | 10 |
| | Depth (mm) | 50 |
| Raw material heating temperature (° C.) | | 2,000 |
| Raw material heating time (hours) | | 10 |
| Crystal growth substrate | Diameter (mm) | 5 |
| AlN single crystal | Diameter (mm) | 5 |
| | Thickness (mm) | 0.5 |

Then, the obtained AlN single crystal was removed from the substrate and processed into an AlN single crystal substrate having a thickness of 300 μm by polishing and processing.

The defect density of the AlN single crystal substrate was measured by the etch pit density measurement, which was $1×10^6$ cm$^{-2}$.

Next, the aforementioned AlN single crystal substrate was washed with an organic solvent and an acid.

Then, after placing a metal mask having a hole portion having a substantially circular shape in plan view with a diameter of 500 µm (first electrode mask) on one surface of the AlN single crystal substrate, Ti, Al, Pt, and Au were laminated in this order from the aforementioned AlN single crystal substrate side by a deposition method, thereby forming a first electrode having a substantially circular shape in plan view with a diameter of 500 µm.

Then, a heat treatment was carried out at 750° C. for 30 seconds in a nitrogen atmosphere.

Next, the first electrode mask was removed, and a metal mask provided with a hole portion having a substantially circular shape in plan view with a diameter of 80 µm (second electrode mask) was placed on the one surface of the AlN single crystal substrate such that the distance between the electrodes was 300 µm, and Pt and Au were laminated in this order from the aforementioned AlN single crystal substrate side, thereby forming a second electrode having a substantially circular shape in plan view with a diameter of 80 µm.

An AlN single crystal Schottky barrier diode (sample of Example 1) was produced through the steps described above.

Semiconductor Properties Evaluation of AlN Diode

The current-voltage characteristics were measured by using a system source meter for measuring the semiconductor properties.

FIG. 5 is a current-voltage characteristic of the AlN single crystal Schottky barrier diode (device of Example 1: AlN SBD) at 300 K.

The sample of Example 1 operated stably at 300 K, showing a rectifying property. The leakage current at the time of applying −40 V to the sample of Example 1 was about 0.1 nA and an on-off ratio at the time of applying 10 V and −40 V was about $10^5$.

Figure 6:
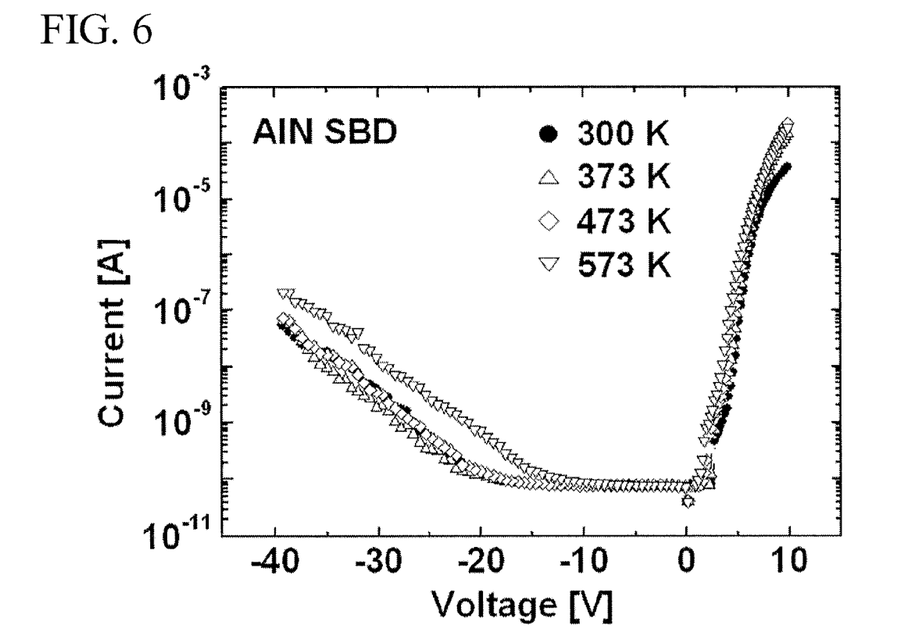
FIG. 6 is a graph showing the temperature dependence of the current-voltage characteristic of the AlN single crystal Schottky barrier diode (device of Example 1: AlN SBD).

FIG. 6 is a graph showing the temperature dependence of the current-voltage characteristic of the AlN single crystal Schottky barrier diode (device of Example 1: AlN SBD). The current-voltage characteristics of the AlN single crystal Schottky barrier diode (device of Example 1: AlN SBD) were measured at each temperature of 300 K, 373 K, 473 K, and 573 K.

The sample of Example 1 operated stably at each temperature, showing a rectifying property.

An on-off ratio at the time of applying 10 V and −40 V and 573 K was about $10^3$.

Example 2

An AlN single crystal (first AlN single crystal layer) was formed on a substrate under the same conditions as those in Example 1 with the exception that the heating time at the time of crystal growth was set to 24 hours. After cooling the substrate to room temperature, on the aforementioned AlN single crystal, an AlN single crystal (second AlN single crystal layer) was grown by setting the heating time to 24 hours once again. As a result, an AlN single crystal thicker than that of Example 1 was obtained.

INDUSTRIAL APPLICABILITY

The AlN diode of the present invention relates to an AlN single crystal Schottky barrier diode having an AlN single crystal of high quality and operates as a diode having a rectifying property such that an on-off ratio at the time of applying 10 V and −40 V is at least $10^3$ even at a high temperature of 573 K, and thus can be used as a power element and applicable in the semiconductor industry and the like. In addition, since the diode operation was successful with a super-wide band gap material, it is believed that the transistor operation is also possible. Furthermore, with the further improvement of crystal growth techniques, it is predicted that high performance devices that match the theoretical prediction can be achieved.

The invention claimed is:

1. An AlN single crystal Schottky barrier diode comprising:
    an AlN single crystal substrate having a defect density of $10^6$ cm$^{-2}$ or less and a thickness of 300 µm or more;
    a first electrode formed on one surface of the AlN single crystal substrate; and
    a second electrode formed on one surface of the AlN single crystal substrate while being spaced apart from the first electrode.

2. The AlN single crystal Schottky barrier diode according to claim 1,
    wherein the first electrode is an ohmic electrode, and the second electrode is a Schottky electrode.

3. The AlN single crystal Schottky barrier diode according to claim 2,
    wherein the first electrode is formed by laminating Ti, Al, Pt, and Au in this order from the AlN single crystal substrate side, and
    the second electrode is formed by laminating Pt and Au in this order from the AlN single crystal substrate side.

4. The AlN single crystal Schottky barrier diode according to claim 3, further comprising:
    an AlN epitaxial layer formed on one surface of the AlN single crystal substrate,
    wherein the first electrode and the second electrode are formed on the AlN epitaxial layer.

5. The AlN single crystal Schottky barrier diode according to claim 2, further comprising:
    an AlN epitaxial layer formed on one surface of the AlN single crystal substrate,
    wherein the first electrode and the second electrode are formed on the AlN epitaxial layer.

6. The AlN single crystal Schottky barrier diode according to claim 2,
    wherein the AlN single crystal substrate comprises oxygen at an arbitrary concentration from $10^{14}$ to $10^{20}$ atoms/cm$^3$.

7. The AlN single crystal Schottky barrier diode according to claim 2,
    wherein the AlN single crystal substrate comprises Si at an arbitrary concentration from $10^{14}$ to $10^{20}$ atoms/cm$^3$.

8. The AlN single crystal Schottky barrier diode according to claim 1, further comprising:
    an AlN epitaxial layer formed on one surface of the AlN single crystal substrate,
    wherein the first electrode and the second electrode are formed on the AlN epitaxial layer.

9. The AlN single crystal Schottky barrier diode according to claim 1,
    wherein the AlN single crystal substrate comprises oxygen at an arbitrary concentration from $10^{14}$ to $10^{20}$ atoms/cm$^3$.

10. The AlN single crystal Schottky barrier diode according to claim 1,
    wherein the AlN single crystal substrate comprises Si at an arbitrary concentration from $10^{14}$ to $10^{20}$ atoms/cm$^3$.

11. A method of producing an AlN single crystal Schottky barrier diode, the method comprising:

a step of producing an AlN single crystal having a diameter of 5 mm or more and a thickness of 500 μm or more by a sublimation method;

a step of forming the AlN single crystal into a plate shape and then polishing both sides thereof, thereby processing into an AlN single crystal substrate having a defect density of $10^6$ cm$^{-2}$ or less, a diameter of 5 mm or more, and a thickness of 300 μm or more; and a step of forming a first electrode and a second electrode, while being spaced apart from each other, on one surface of the AlN single crystal substrate by a deposition method or a sputtering method.

12. The method of producing an AlN single crystal Schottky barrier diode according to claim 11, wherein the first electrode is formed by laminating Ti, Al, Pt, and Au in this order from the AlN single crystal substrate side, and the second electrode is formed by laminating Pt and Au in this order from the AlN single crystal substrate side.

13. The method of producing an AlN single crystal Schottky barrier diode according to claim 12, wherein an AlN single crystal having a substantially cylindrical shape is cut in a direction perpendicular to an axial direction to thereby form the AlN single crystal into a plate shape.

14. The method of producing an AlN single crystal Schottky barrier diode according to claim 12, wherein the first electrode and the second electrode are formed after washing the AlN single crystal substrate with an organic solvent and an acid.

15. The method of producing an AlN single crystal Schottky barrier diode according to claim 12, the method further comprising:

a step of forming an AlN epitaxial layer on one surface of the AlN single crystal substrate, wherein the first electrode and the second electrode are formed on the AlN epitaxial layer.

16. The method of producing an AlN single crystal Schottky barrier diode according to claim 12, wherein the step of producing an AlN single crystal by a sublimation method comprises a step of forming a first AlN layer on a crystal growth substrate by carrying out heating for 5 hours to 50 hours at a sublimation temperature of AlN raw materials, followed by cooling of the crystal growth substrate to room temperature; and further comprises a step of forming an AlN single crystal on the first AlN layer by heating the AlN raw materials at the sublimation temperature which is carried out once or a plurality of times.

17. The method of producing an AlN single crystal Schottky barrier diode according to claim 11, wherein an AlN single crystal having a substantially cylindrical shape is cut in a direction perpendicular to an axial direction to thereby form the AlN single crystal into a plate shape.

18. The method of producing an AlN single crystal Schottky barrier diode according to claim 11, wherein the first electrode and the second electrode are formed after washing the AlN single crystal substrate with an organic solvent and an acid.

19. The method of producing an AlN single crystal Schottky barrier diode according to claim 11, the method further comprising:

a step of forming an AlN epitaxial layer on one surface of the AlN single crystal substrate, wherein the first electrode and the second electrode are formed on the AlN epitaxial layer.

20. The method of producing an AlN single crystal Schottky barrier diode according to claim 11, wherein the step of producing an AlN single crystal by a sublimation method comprises a step of forming a first AlN layer on a crystal growth substrate by carrying out heating for 5 hours to 50 hours at a sublimation temperature of AlN raw materials, followed by cooling of the crystal growth substrate to room temperature; and further comprises a step of forming an AlN single crystal on the first AlN layer by heating the AlN raw materials at the sublimation temperature which is carried out once or a plurality of times.

\* \* \* \* \*